United States Patent [19]
Miyamoto et al.

[11] Patent Number: 6,039,896
[45] Date of Patent: Mar. 21, 2000

[54] ANISOTROPIC CONDUCTIVE ADHESIVE AND METHOD FOR PREPARATION THEREOF AND AN ELECTRONIC APPARATUS USING SAID ADHESIVE

[75] Inventors: Tetsuya Miyamoto, Higashimine-machi; Masakazu Kawata, Utsunomiya, both of Japan

[73] Assignee: Sumitomo Bakelite Co., Ltd., Tokyo, Japan

[21] Appl. No.: 09/268,312

[22] Filed: Mar. 16, 1999

[30] Foreign Application Priority Data

| Mar. 18, 1998 | [JP] | Japan | 10-068530 |
| May 22, 1998 | [JP] | Japan | 10-141471 |
| Oct. 13, 1998 | [JP] | Japan | 10-291101 |
| Dec. 14, 1998 | [JP] | Japan | 10-354953 |

[51] Int. Cl.$^7$ .................................................. H01B 1/06
[52] U.S. Cl. .................. 252/511; 252/512; 252/513; 349/122; D14/100; 361/683
[58] Field of Search ................................. 252/510–514

[56] References Cited

U.S. PATENT DOCUMENTS

| 4,777,204 | 10/1988 | Ikenaga et al. | 524/439 |
| 5,403,873 | 4/1995 | Nakamura et al. | 523/201 |
| 5,486,580 | 1/1996 | Newsham et al. | 525/504 |

OTHER PUBLICATIONS

Patent Abstract of Japan, Publication No. 10–140116 A, Publication Date May 26, 1998.
Patent Abstract of Japan, Publication No. 10–183098 A, Publication Date Jul. 7, 1998.

*Primary Examiner*—Mark Kopec
*Assistant Examiner*—Derrick G. Hamlin
*Attorney, Agent, or Firm*—Kubovcik & Kubovcik

[57] ABSTRACT

An anisotropic conductive adhesive contains conductive particles dispersed in a resin composition, wherein the resin composition includes a radical polymerization resin (A), an organic peroxide (B), a thermoplastic elastomer (C) and a phosphoric ester (D). The resin composition can further contain an epoxy silane coupling agent (E) represented by formula (2) or (3). The resin composition is mixed with other components after the radical polymerization resin (A), the thermoplastic elastomer (C), the phosphoric ester (D) and the epoxy silane coupling agent (E) are reacted. It is also possible to preliminarily react only the phosphoric ester (D) and the epoxy silane coupling agent (E) and to react the product of the preliminary reaction with the radical polymerization resin (A) and the thermoplastic elastomer (C), and then to add other components. The anisotropic conductive adhesive of the present invention can be used for electrical joining of electronic or electric parts of electrical apparatus.

14 Claims, 1 Drawing Sheet

Fig. 1

ANISOTROPIC CONDUCTIVE ADHESIVE AND METHOD FOR PREPARATION THEREOF AND AN ELECTRONIC APPARATUS USING SAID ADHESIVE

FIELD OF THE INVENTION

The present invention relates to an anisotropic conductive adhesive that is used for joining minute circuits, e.g., a liquid crystal display (LCD) and a tape carrier package (TCP), TCP and a printed circuit board (PCB), and the like, a method for preparing the adhesive and an electronic apparatus in which the adhesive is used for the manufacture thereof.

BACKGROUND OF THE INVENTION

Recently there has been a dramatic increase in the need to join fine circuits, for example, a liquid crystal display (LCD) and a tape carrier package (TCP), TCP and a printed circuit board (PCB), and the like. An anisotropic conductive adhesive in which conductive particles are dispersed in a resin is used for such purposes. The anisotropic conductive adhesive is placed between parts which are to be connected to each other, and is heated and is pressed. Adjacent terminals in a direction parallel to the substrate surface are still insulated, but adjacent terminals in a direction perpendicular to the substrate surface are conductive. The reason why an anisotropic conductive adhesive has been commonly used to connect materials as explained above is because conventional methods, for example, soldering and the like, cannot be applied to the devices. Materials for the devices explained above are normally not heat resistant and if the conventional methods are applied to the devices there is a risk of a short-circuit between adjacent terminals in the fine circuits.

There are two types of anisotropic conductive adhesives, i.e., a thermoplastic resin type and a thermosetting resin type. The thermosetting resin type is especially an epoxy resin which is considered more reliable and is becoming more widely used than the thermoplastic resin type because of problems of the thermoplastic resin type as explained below.

A styrene copolymer, for example, styrene-butadiene-styrene (SBS), styrene-isoprene-styrene(SIS), styrene-ethylene-butadiene-styrene(SEBS) and the like, are mainly used as the thermoplastic resin type of anisotropic conductive adhesive. The thermoplastic resin type adhesive is fusible, and it is believed that its processability is better than the thermosetting resin type adhesive because it requires a relatively low temperature and short time for bonding. However, the thermoplastic resin type is not practically acceptable since it cannot give satisfactory results in a long term environmental test because of insufficiency of bonding reliability caused by low water-vapor resistance and chemical resistance.

On the other hand, a thermoset epoxy resin is recently mainly used as the thermosetting resin type anisotropic conductive adhesive because the thermoset epoxy resin has generally well-balanced storage stability and curing characteristics. It is necessary, however, to heat and cure the epoxy resin at a temperature of 150~200° C. and for about 30 seconds from a practical standpoint. It is difficult to cure within a practical cure time at a temperature of less than 150° C.

It has been proposed to provide an adhesive containing a latent curing agent, for example, $BF_3$ amine complex, dicyandiamide, a hydrazide of an organic acid, an imidazole compound and the like, to improve storage stability of a thermosetting resin type anisotropic conductive adhesive. If the adhesive has improved storage stability, however, it takes a longer time or a high temperature to cure. On the other hand, if the adhesive can cure in a shorter time at a low temperature, it does not have a good storage property. Both are unsatisfactory.

Although when a thermoplastic resin type anisotropic conductive adhesive is used, it is not difficult to repair defects after bonding because the resin, which is not cured, is easy to dissolve with a solvent, it is difficult to debond fine circuits after they have been bonded with a thermoset resin type anisotropic conductive adhesive to correct defects, for example, misalignment, without breakage or damage of the bonded parts. Such requirement conflicts with the properties of the thermoset resin type adhesive, i.e., high-adhesive properties and good bonding reliability. None of the conventional thermoset resin type adhesives can satisfy this requirement.

There has rapidly been developed a LCD module having a big screen and narrow frame and being extremely precise. It has been accompanied by miniaturizing of bonding pitch or narrowing of bonding width. When LCD and TCP are bonded, misalignment in the bonding pattern occurs because of stretching of TCP, or internal components of LCD are damaged by high bonding temperature because a bonding portion is very narrow. After LCD is bonded with TCP, and then TCP is bonded with PCB, PCB and LCD are warped because PCB tends to be stretched by heat at bonding, but heat is not transferred to LCD so much and LCD has a small linear expansion. Therefore, breaking of TCP wiring occurs.

Bonding at a low temperature has been attempted in order to solve the problems explained above. Although it is possible to bond by a conventional thermoplastic resin type anisotropic conductive adhesive at a low temperature, bonding reliability is low because water vapor resistance and heat resistance of the resin are low. On the other hand, when an epoxy resin, which is the major thermoset resin for an anisotropic conductive adhesive is used, it is necessary to extend bonding time to cure the resin. This is not practical.

It has also been proposed that conductive particles are dispersed in a resin comprising a cationic polymerization material and sulfonium salt as an anisotropic conductive adhesive capable of bonding at low temperature (Japanese Patent Laid-Open Publication No. Hei 7-90237). It has been further proposed to disperse conductive particles in a composition of an epoxy resin and a 4-(dialkyl amino)pyridine derivative (Japanese Patent Laid-Open Publication No. Hei 4-189883). However, these proposals are not satisfactory for practical application because of problems, for example, insufficient storage stability of the adhesive resin, corrosion of bonded circuit terminals and the like.

An anisotropic conductive adhesive has been proposed which can be cured at low temperatures in which conductive particles are dispersed in a resin composition containing a radical polymerization resin, an organic peroxide, a thermoplastic elastomer, and a maleimide in which the radical polymerization resin is a methacryloyl phenolic novolak resin. An adhesive in which an amino silane coupling agent is added to improve adhesive properties and bonding reliability has also been proposed. However, an adhesive resin, which has well-balanced properties, i.e., curing characteristics, processability, adhesive properties at high temperature and high humidity, bonding reliability, storage properties and the like, has not been obtained. There is a strong demand for an anisotropic conductive adhesive that can cure in a short time and has excellent adhesive properties, bonding reliability, storage stability, repair properties and the like.

OBJECTS OF THE INVENTION

An object of the present invention is to provide a thermosetting resin type anisotropic conductive adhesive which can be used to connect electrically fine circuits, for example, LCD and TCP, TCP and PCB, and the like at a low temperature in a short time and which, furthermore, has excellent adhesive properties, bonding reliability, storage properties and repair properties.

It is a further object to provide a method for preparing a thermosetting resin type anisotropic conductive adhesive having excellent adhesive properties, bonding reliability, storage properties and repair properties.

It is also an object to provide electronic apparatus having electronic or electric components having bonding reliability and good repair properties.

BRIEF DESCRIPTION OF THE DRAWING

The following elements are shown in the drawing.

1: carrier film
2: an anisotropic conductive adhesive
3: conductive particles
4 and 4': circuit electrodes
5: PCB (a printed circuit boad)
6: TCP (a tape carrier package)

SUMMARY OF THE INVENTION

The present invention provides an anisotropic conductive adhesive comprising conductive particles dispersed in a resin composition, wherein the resin composition comprises a radical polymerization resin (A), an organic peroxide (B), a thermoplastic elastomer (C) and a phosphoric ester (D) represented by a formula (1)

(1)

wherein $R^1$ is $CH_2=CR_1CO(OR_2)_n$ where $R_1$ is —H or —$CH_3$, $R_2$ is —$C_2H_4$—, —$C_3H_6$—, —$CH_2CH(CH_3)$—, —$C_4H_8$—, —$C_5H_{10}$—, —$C_6H_{12}$— or —$C_2H_4$—O—CO—$C_5H_{10}$ and n is an integer of 1–10; l is 1 or 2 and m is 1 or 2.

It is preferable that a blending ratio of (A), (B), (C) and (D) in parts by weight part is within a range of (D)/{(A)+(B)+(C)}×100=(0.1~50).

The resin composition can further contains an epoxy silane coupling agent (E) represented by formula (2) or (3)

(2)

(3)

wherein $R^2$ is —CH, or —$C_2H_5$.

The resin composition is mixed (blended) with other components after the radical polymerization resin (A), the thermoplastic elastomer (C), the phosphoric ester (D) represented by the formula (1) and the epoxy silane coupling agent (E) represented by the formula (2) or (3) are reacted. The reaction is conducted at a temperature of 0~50° C. It is also possible to preliminary react only the phosphoric ester (D) and the epoxy silane coupling agent (E) at a temperature of 0~50° C., and to react the product of preliminary reaction with the radical polymerization resin (A) and the thermoplastic elastomer (C), and then to add other components. A blending ratio of (A), (B), (C), (D) and (E) in parts by weight is within a range of {(D)+(E)}/{(A)+(B)+(C)}×100=(0.1~20). A blending ratio of the phosphoric ester (D) and the epoxy silane coupling agent (E) in parts by weight is (D)/(E)=90/10~10/90.

A method of preparing a thermosetting resin type anisotropic conductive adhesive which includes conductive particles dispersed in a resin composition comprises reacting a radical polymerization resin (A), a thermoplastic elastomer (C), a phosphoric ester (D) and an epoxy silane coupling agent (E) to form a preliminary reaction product, and thereafter combining the reaction product with an organic peroxide (B) and the conductive particles.

A further method of preparing a thermosetting resin type anisotropic conductive adhesive which includes conductive particles dispersed in a resin composition comprises reacting a phosphoric ester (D) and an epoxy silane coupling agent (E) to form a first reaction product, reacting the first reaction product with a radical polymerization resin (A) and a thermoplastic elastomer (C) to form a second reaction product, and then mixing said second reaction product with an organic peroxide (B) and the conductive particles.

The anisotropic conductive adhesive of the present invention can be used for electrical joining of electronic or electric parts of electrical apparatus. As the electronic or electric parts, there are illustrated a semiconductor element, a semiconductor device, a printed circuit board, a liquid crystal display (LCD) panel, plasma display panel (PDP), electroluminescence (EL) panel, field emission display (FED) panel, tape carrier package and the like. As the electrical apparatus in which the electronic or electric parts are used, there can be mentioned an image display module (LCD, PDP, EL, FED), a computer, television, a measuring instrument and apparatus, a communication device and the like.

DESCRIPTION OF PREFERRED EMBODIMENT

The present invention is described below in detail.

The anisotropic conductive adhesive of the present invention is characterized by a phosphoric ester represented by the formula (1) in the resin component. For example, when TCP and PCB for LCD are bonded by the anisotropic conductive adhesive of the present invention, the phosphoric ester causes coupling between the radical polymerization resin and metal parts of substrates (TCP and PCB). Therefore, excellent bonding properties and bonding reliability which cannot be obtained by conventional adhesives can be obtained. When an epoxy silane coupling agent represented by the formula (2) and (3) are added, a better coupling effect can be obtained.

If a phosphoric ester other than that represented by formula (1) is used, a coupling effect between the radical polymerization resin and metal parts of substrates is not sufficient. The epoxy silane coupling agent represented by the formula (2) or (3) provides a better coupling effect as compared to different silane coupling agents.

There is a tendency when the components (A), (C), (D) and (E) are mixed directly with other components of the resin, that they react with other components in the resin. The final product has good adhesive force as an anisotropic conductive adhesive soon after manufacture, but loses the coupling effect of components (D) and (E) day by day. It was discovered that when the components (A), (C), (D) and (E) are preliminarily reacted, and combined with other components, the obtained adhesive maintains stability as an anisotropic conductive adhesive for a long period and provides excellent adhesive force.

The conditions for the preliminary reaction are not particulary limited. It is preferable that the reaction is conducted at 0~50° C. to effectively perform the reaction. If the reaction is conducted at a temperature of lower than 0° C., progress of the reaction is very slow and takes a lot of time. Therefore, such a reaction condition is not practical. If the reaction temperature is higher than 50° C., side reactions may occur. Reaction time is also not limited. It is preferably 1 to 7 days. The reaction is not performed sufficiently within one day. Since the reaction is completed within seven days, more than seven days is not necessary.

It was discovered that when components (D) and (E) are reacted before components (A) and (C) are added, stability of the final product is further improved. There are no particular limitations of the method of reacting components (D) and (E). However, it is preferable that the reaction is conducted in a solvent. If the reaction is not conducted in a solvent, the reaction progresses rapidly, and the product is a gel. The solvent is not limited. A ketone, for example, acetone, methyl ethyl ketone, methyl isobutyl ketone or the like, is preferred. There is also no limitation concerning the amount of components (D) and (E) in the solvent. The amount is preferably within a range of 1 to 80% by weight. If the amount of components (D) and (E) is less than 1% by weight, progress of the reaction is very slow. If the amount of components (D) and (E) is greater than 80% by weight, progress of the reaction is too fast. The reaction temperature is preferably in a range of 0~50° C. If the reaction temperature is lower than 0° C., it takes a long time to complete the reaction because the reaction rate is very slow. If the reaction temperature is higher than 50° C., a side reaction may occur. The reaction time is preferably between 10 minutes and 24 hours. If the reaction time is less than 10 minutes, the reaction is not sufficiently completed. Since the reaction is completed within 24 hours, longer than 24 hours is not necessary.

As the radical polymerization resin used in the present invention, there are illustrated methacryloyl phenolic novolak resins containing phenolic hydroxyl groups, vinyl ester resins, acrylates, for example, urethane acrylate resins, unsaturated polyester resins, diallyl phthalate resins and maleimide resins. Methacryloyl phenolic novolak resins containing phenolic hydroxyl groups, vinyl ester resins, urethane acrylate resins and maleimide resins are preferred in that they have good curing characteristics, storage properties, heat resistance, water- vapor resistance and chemical resistance.

It is also possible to add a polymerization inhibitor to the anistropic conductive adhesive of the present invention, for example, quinone, polyphenol, phenol and the like, to obtain better storage properties as suggested in Japanese Patent Laid- Open Publication No. Hei 4-146951. It is also possible to dilute the anistropic conductive adhesive of the present invention with an acrylate, for example, trimethylolpropane triacrylate (TMPTA), pentaerythritol diallylate monostearate, tetraethyleneglycol diacrylate, pentaerythritol tetraacrylate and the like, or a monomer, for example, styrene, or a conventional reactive diluent.

The organic peroxide used in the present invention is not specifically limited insofar as an adhesive having the desired properties is obtained. The following organic peroxides can be mentioned:
1,1,3,3-tetramethylbutylperoxy-2-ethylhexanoate,
t-butylperoxy-2-ethylhexanoate,
t-hexylperoxy-2-ethylhexanoate,
1,1-bis(t-butylperoxy)-3,3,5-trimethylcyclohexane,
1,1-bis(t-hexylperoxy)-3,3,5-trimethylcyclohexane,
bis(4-t-butylcyclohexyl)peroxydicarbonate and the like.
These peroxides can be used alone or in the form of a mixture of two or more to control curing characteristics. It is possible to add a polymerization inhibitor. It is also possible to dilute with a solvent to make it easy to solve the peroxide in the resin. It is of course understood that choice of the peroxide or an amount used is determined according to desired characteristics, i.e., curing properties and storage stability, of the final product.

There are no limitations concerning the thermoplastic elastomer to be used in the present invention insofar as an adhesive having the desired properties is obtained. A polyester resin, a polyurethane resin, a polyimide resin, polybutadiene, polypropylene, styrene-butadiene-styrene copolymer, polyacetal resin, a polyvinylbutyral resin, butyl rubber, chloroprene rubber, polyamide resin, acrylonitrile-butadiene copolymer, acrylonitrile-butadiene-methacrylic acid copolymer, acrylonitrile-butadiene-styrene copolymer, polyvinyl acetate resin, nylon, styrene-isoprene copolymer, styrene-butylene-styrene block copolymer, styrene-ethylene-butylene-styrene block copolymer, polymethyl methacrylate resin and the like can be illustrated. Acrylonitrile-butadiene-methacrylic acid copolymer, polyester, polyamide resin, nylon, polyvinylbutyral resin, styrene-ethylene-butylene-styrene block copolymer are preferable for managing curing bond properties and bonding reliability of the final product, i.e., the anisotropic conductive adhesive.

The phosphoric ester to be used in the present invention is not limited to special ones, as long as the phosphoric ester is represented by the formula (1). The phosphoric ester can be used alone or in the form of a mixture of two or more thereof. As the phosphoric ester, (meth)acryloyl hydroxyethyl acid phosphate, (meth)acryloyl hydroxypropyl acid phosphate, (meth)acryloyl hydroxyisopropyl acid phosphate, (meth)acryloyl hydroxy polyhydroxyethylene glycol acid phosphate, (meth)acryloyl hydroxypropyleneglycol acid phosphate, caprolactam modified (meth)acryloyl hydroxyethyl acid phosphate, di(meth)acryloyl hydroxypropyl acid phosphate, di[caprolactam modified (meth)acryloyl hydroxyethyl]acid phosphate and the like can be illustrated.

The epoxy silane coupling agent to be used in the present invention is also not limited to special ones, if the epoxy silane coupling agent is represented by the formula (2) or (3). The epoxy silane coupling agent can be used alone or in the form of a mixture of two or more. As the epoxy silane coupling agent, the folllowng silanes can be illustrated:
β-(3,4-epoxycyclohexyl)ethyl trimethoxy silane,
β-(3,4-epoxycyclohexyl)ethyl triethoxy silane,
β-(3,4-epoxycyclohexyl)ethyl dimethoxymethyl silane,
β-(3,4-epoxycyclohexyl)ethyl methoxydimethyl silane,
β-(3,4-epoxycyclohexyl)ethyl diethoxyethyl silane,
β-(3,4-epoxycyclohexyl)ethyl ethoxydiethyl silane,
γ-glycidoxypropyltrimethoxysilane,
γ-glycidoxypropyltriethoxysilane,
γ-glycidoxypropylmethyldimethoxysilane,
γ-glycidoxypropylmethoxydimethylsilane,
γ-glycidoxypropylethyldiethoxysilane, γ-glycidoxypropylethoxydiethylsilane and the like.

A blending ratio of (D) to (A), (B) and (C) in parts by weight within a range of (D)/{(A)+(B)+(C)}×100=(0.1~50) is preferable. If the ratio is less than 0.1%, a coupling effect to obtain sufficient adhesion cannot be obtained. If the ratio is more than 50%, deterioration of curing properties and storage stability of the adhesive results.

A blending ratio of (A), (B), (C), (D) and (E) in parts by weight is preferably within a range of {(D)+(E)}/{(A)+(B)+(C)}×100=(0.1~20). If the blending ratio is less than 1%, a coupling effect to obtain sufficient adhesion cannot be obtained. If the blending ratio is more than 20%, deterioration of curing properties and storage stability of the adhesive results.

A blending ratio of the phosphoric ester (D) and the epoxy silane coupling agent (E) in parts by weight is preferably (D)/(E)=90/10~10/90. If the ratio of the phosphoric ester is more than 90/10, pH of the resin composition is low and results in deterioration of storage stability of the adhesive. If the ratio of the phosphoric ester is less than 10/90, a sufficient coupling effect cannot be obtained and adhesion is deteriorated.

The conductive particles to be used in the present invention are not particularly limited if they have electrical conductivity. Metal particles, for example, nickel, iron, copper, aluminum, tin, lead, chlorine, cobalt, silver, gold and the like, particles of alloys, metallic oxides, and carbon, graphite, glass, ceramic and plastic particles having metallic coatings and the like can be illustrated. The diameter, material, and blending ratio to the resin composition of the conductive particles are determined dependent on the pitch or pattern of circuits to be bonded, and the thickness or material of the circuit terminal to be bonded.

ADVANTAGES OF THE INVENTION

The thermosetting resin type anisotropic conductive adhesive of the present invention provides excellent bonding properties, bonding reliability, storage stability and repair properties. Curing temperature and curing time of the anisotropic conductive adhesive of the present invention are low and short, respectively.

When the anisotropic conductive adhesive is used to bond electronic and electric parts for a semiconductor element, a semiconductor device, a printed circuit board, a liquid crystal display (LCD) panel, a plasma display panel (PDP), an electroluminescence (EL) panel, a field emission display (FED) panel, a tape carrier package and the like, it is possible to miniaturize, lighten the weight and facilitate manufacturing of an image display module (LCD, PDP, EL, FED), a computer, television, a measuring instrument and apparatus, a communication device and the like as well as to improve ease of handling of repairs.

EXAMPLES

Materials used in the examples and comparative examples are shown in Table 1.

TABLE 1

| Radical polymerization resin | G | Methacryloyl phenolic novolak resin [formula (4)] |
| --- | --- | --- |
|  | H | Urethane acrylate resin [formula (5)] |
|  | I | Vinyl ester resin [formula (6)] |
|  | J | Bismaleimide resin [formula (7)] |
|  | K | Amine modified bismaleimide resin [formula (8)] |
| Organic peroxide |  | 1,1,3,3,-Tetramethylbutylperoxy-2-ethylhexanoate |
| Thermoplastic elastomer | L | Acrylonitrile-butadiene-methacrylic acid copolymer [formula (9)] |
|  | M | Saturated polyester copolymer (Molecular weight 25,000, softening temperature 120° C.) |
|  | N | Epoxidized-styrene-ethylene-butylene-styrene copolymer |
|  | O | Polyvinylbutyral (polymerization degree 500, butyralization degree 70 mol %) |
| Phosphoric ester | P | Caprolactam modified (meth)acryloyl hydroxyethyl acid phosphate |
|  | Q | (Meth)acryloyl hydroxyethyl acid phosphate |
| Epoxy silane coupling agent | R | β-(3,4-epoxycyclohexyl)ethyl trimethoxy silane |
|  | S | γ-glycidoxypropyltrimethoxy silane |
| Vinyl silane coupling agent |  | vinyltrimethoxy silane |
| Methacryl silane coupling agent |  | γ-methacryloxypropyltrimethoxy silane |
| Conductive particles |  | Ni/Au metallized polystyrene particle (average particle diameter 5 μm) |

(4)

n/m + n = 0.7/1, m + n = 8

-continued

(5)

n = 1 ~ 5

(6)

n = 5

(7)

(8)

n = 1 ~ 10

(9)

1:1.27 wt %, n:4.0 mol%, molecular weight: 100,000

Example 1

200 Parts by weight of a 50% solution of methacryloyl phenolic novolac resin represented by formula (4) dissolved in methyl ethyl ketone, 350 parts by weight of a 20% solution of diaminodiphenylmethane type bismaleimide represented by formula (7) dissolved in tetrahydrofuran, 5 parts by weight of 1,1,3,3- tetramethylbutylperoxyhexanoate, 500 parts by weight of a 20% solution of acrylonitrile-butadienemethacrylic acid copolymer dissolved in methyl ethyl ketone, 5 parts by weight of caprolactam modified (meth) acryloyl hydroxyethyl acid phosphate and 7 parts by weight of Ni/Au metallized polystyrene particles were mixed and were evenly dispersed. The mixture was cast on polyethyleneterephthalate film treated with a mold parting agent to a thickness of 45 μm after drying. After drying, the product was cut to a width of 2 mm to obtain an anisotropic conductive adhesive.

Examples 2~18

Anisotropic conductive adhesives were prepared in the same manner as Example 1 except that materials and amounts of materials shown in Tables 2 and 3 were used.

TABLE 2

| | | Example | | | | |
|---|---|---|---|---|---|---|
| | | 1 | 2 | 3 | 4 | 5 |
| Radical polymerization resin | G 50% solution of Methyl ethyl ketone | 200 | 200 | 200 | 200 | 200 |
| | H | | | | | |
| | I 50% solution of Methyl ethyl ketone | | | | | |
| | J 20% solution of Tetrahydrofuran | 350 | 350 | 350 | 350 | 350 |
| | K 20% solution of Methyl ethyl ketone | | | | | |
| Organic peroxide | | 5 | 5 | 5 | 5 | 5 |
| Thermoplastic elastomer | L 20% solution of Methyl ethyl ketone | 500 | 500 | 500 | 500 | 500 |
| | M 50% solution of Methyl ethyl ketone | | | | | |
| | N 20% solution of Methyl ethyl ketone | | | | | |
| | O 30% solution of Methyl ethyl ketone | | | | | |
| Phosphoric ester | P | 5.0 | 0.1 | 150 | 5.0 | 3.5 |
| | Q | | | | | |
| Epoxy silane coupling agent | R | | | | 1.5 | 3.0 |
| | S | | | | | |
| Conductive particle | | 7.0 | 7.0 | 7.0 | 7.0 | 7.0 |
| Reaction temp. of (A) & (E) (° C.) | | | | | | |
| Reaction time of (A) & (E) (hrs) | | | | | | |
| Reaction temp. of (A), (B), (C) & (D) (° C.) | | | | | | |
| Reaction time of (A), (B), (C) & (D) (days) | | | | | | |
| (D)/{(A) + (B) + (C)} | | 1.8/100 | 0.04/100 | 54.5/100 | 1.8/100 | 1.3/100 |
| {(D) + (E)}/{(A) + (B) + (C)} | | 1.8/100 | 0.04/100 | 54.5/100 | 2.4/100 | 2.4/100 |
| (D)/(E) | | 100/0 | 100/0 | 100/0 | 77/23 | 54/46 |
| Bond strength (g/cm) | Initial | 1100 | 700 | 1500 | 1700 | 1500 |
| | After treatment | 1000 | 600 | 1200 | 1500 | 1500 |
| Bonding reliability (Ω) | Initial | 1.2 | 1.2 | 1.2 | 1.1 | 1.1 |
| | After treatment | 1.3 | 1.3 | 1.3 | 1.2 | 1.3 |
| Repairing properties | | | | | | |
| Storage properties | | ○ | ○ | ○ | ○ | ○ |

| | | Example | | | |
|---|---|---|---|---|---|
| | | 6 | 7 | 8 | 9 |
| Radical polymerization resin | G 50% solution of Methyl ethyl ketone | 200 | 200 | 200 | 200 |
| | H | | | | |
| | I 50% solution of Methyl ethyl ketone | | | | |
| | J 20% solution of Tetrahydrofuran | 350 | 350 | 350 | 350 |
| | K 20% solution of Methyl ethyl ketone | | | | |
| Organic peroxide | | 5 | 5 | 5 | 5 |
| Thermoplastic elastomer | L 20% solution of Methyl ethyl ketone | 500 | 500 | 500 | 500 |
| | M 50% solution of Methyl ethyl ketone | | | | |
| | N 20% solution of Methyl ethyl ketone | | | | |
| | O 30% solution of Methyl ethyl ketone | | | | |
| Phosphoric ester | P | 10.0 | 0.1 | 46.2 | 6.0 |
| | Q | | | | |

TABLE 2-continued

|  |  |  |  |  |  |
|---|---|---|---|---|---|
| Epoxy silane | R | 3.0 | 0.03 | 13.8 | 0.5 |
| coupling agent | S |  |  |  |  |
| Conductive particle |  | 7.0 | 7.0 | 7.0 | 7.0 |
| Reaction temp. of (A) & (E) (° C.) |  |  |  |  |  |
| Reaction time of (A) & (E) (hrs) |  |  |  |  |  |
| Reaction temp. of (A), (B), (C) & (D) (° C.) |  |  |  |  |  |
| Reaction time of (A), (B), (C) & (D) (days) |  |  |  |  |  |
| (D)/{(A) + (B) + (C)} |  | 3.6/100 | 0.04/100 | 16.8/100 | 1.8/100 |
| {(D) + (E)}/{(A) + (B) + (C)} |  | 4.7/100 | 0.05/100 | 21.8/100 | 2.4/100 |
| (D)/(E) |  | 77/23 | 77/23 | 77/23 | 92/8 |
| Bond strength | Initial | 1900 | 1000 | 2000 | 1200 |
| (g/cm) | After treatment | 1800 | 900 | 2100 | 1000 |
| Bonding | Initial | 1.1 | 1.2 | 1.1 | 1.2 |
| reliability | After treatment | 1.2 | 1.3 | 1.4 | 1.5 |
| (Ω) |  |  |  |  |  |
| Repairing properties |  |  |  |  |  |
| Storage properties |  | ○ | ○ | ○ | ○ |

TABLE 3

|  |  | Example | | | | |
|---|---|---|---|---|---|---|
|  |  | 10 | 11 | 12 | 13 | 14 |
| Radical polymerization resin | G 50% solution of Methyl ethyl ketone | 200 | 200 | 200 | 200 |  |
|  | H |  |  |  |  | 100 |
|  | I 50% solution of Methyl ethyl ketone |  |  |  |  |  |
|  | J 20% solution of Tetrahydrofuran | 350 | 350 | 350 | 350 | 350 |
|  | K 20% solution of Methyl ethyl ketone |  |  |  |  |  |
| Organic peroxide |  | 5 | 5 | 5 | 5 | 5 |
| Thermoplastic elastomer | L 20% solution of Methyl ethyl ketone | 500 | 500 | 500 | 500 | 500 |
|  | M 50% solution of Methyl ethyl ketone |  |  |  |  |  |
|  | N 20% solution of Methyl ethyl ketone |  |  |  |  |  |
|  | O 30% solution of Methyl ethyl ketone |  |  |  |  |  |
| Phosphoric ester | P | 0.5 |  | 5.0 | 5.0 | 5.0 |
|  | Q |  | 5.0 |  |  |  |
| Epoxy silane coupling agent | R | 6.0 | 1.5 |  | 1.0 | 1.5 |
|  | S |  |  | 1.5 | 0.5 |  |
| Conductive particle |  | 7.0 | 7.0 | 7.0 | 7.0 | 7.0 |
| Reaction temp. of (A) & (E) (° C.) |  |  |  |  |  |  |
| Reaction time of (A) & (E) (hrs) |  |  |  |  |  |  |
| Reaction temp. of (A), (B), (C) & (D) (° C.) |  |  |  |  |  |  |
| Reaction time of (A), (B), (C) & (D) (days) |  |  |  |  |  |  |
| (D)/{(A) + (B) + (C)} |  | 1.8/100 | 1.8/100 | 1.8/100 | 1.8/100 | 1.8/100 |
| {(D) + (E)}/{(A) + (B) + (C)} |  | 2.4/100 | 2.4/100 | 2.4/100 | 2.4/100 | 2.4/100 |
| (D)/(E) |  | 8/92 | 77/23 | 77/23 | 77/23 | 77/23 |
| Bond strength | Initial | 1100 | 1600 | 1400 | 1800 | 1700 |
| (g/cm) | After treatment | 800 | 1600 | 1500 | 1900 | 1600 |
| Bonding | Initial | 1.1 | 1.1 | 1.1 | 1.1 | 1.2 |
| reliability | After treatment | 1.2 | 1.2 | 1.3 | 1.3 | 1.3 |
| (Ω) |  |  |  |  |  |  |
| Repairing properties |  |  |  |  |  |  |
| Storage properties |  | ○ | ○ | ○ | ○ |  |

|  |  | Example | | | |
|---|---|---|---|---|---|
|  |  | 15 | 16 | 17 | 18 |
| Radical polymerization resin | G 50% solution of Methyl ethyl ketone |  | 200 | 200 | 200 |
|  | H |  |  |  |  |
|  | I 50% solution of Methyl ethyl ketone | 200 |  |  |  |
|  | J 20% solution of | 350 |  | 350 | 350 |

TABLE 3-continued

|  |  |  |  |  |  |
|---|---|---|---|---|---|
|  | Tetrahydrofuran K 20% solution of Methyl ethyl ketone |  | 350 |  |  |
| Organic peroxide |  | 5 | 5 | 5 | 5 |
| Thermoplastic elastomer | L 20% solution of Methyl ethyl ketone | 500 | 500 |  |  |
|  | M 50% solution of Methyl ethyl ketone |  |  | 200 |  |
|  | N 20% solution of Methyl ethyl ketone |  |  |  | 500 |
|  | O 30% solution of Methyl ethyl ketone |  |  |  |  |
| Phosphoric ester | P Q | 5.0 | 5.0 | 5.0 | 5.0 |
| Epoxy silane coupling agent | R S | 1.5 | 1.5 | 1.5 | 1.5 |
| Conductive particle |  | 7.0 | 7.0 | 7.0 | 7.0 |
| Reaction temp. of (A) & (E) (° C.) |  |  |  |  |  |
| Reaction time of (A) & (E) (hrs) |  |  |  |  |  |
| Reaction temp. of (A), (B), (C) & (D) (° C.) |  |  |  |  |  |
| Reaction time of (A), (B), (C) & (D) (days) |  |  |  |  |  |
| (D)/{(A) + (B) + (C)} |  | 1.8/100 | 1.8/100 | 1.8/100 | 1.8/100 |
| {(D) + (E)}/{(A) + (B) + (C)} |  | 2.4/100 | 2.4/100 | 2.4/100 | 2.4/100 |
| (D)/(E) |  | 77/23 | 77/23 | 77/23 | 77/23 |
| Bond strength (g/cm) | Initial | 1500 | 1600 | 1400 | 1500 |
|  | After treatment | 1500 | 1500 | 1100 | 1200 |
| Bonding reliability (Ω) | Initial | 1.1 | 1.1 | 1.2 | 1.3 |
|  | After treatment | 1.2 | 1.3 | 1.3 | 1.4 |
| Repairing properties |  |  |  |  |  |
| Storage properties |  | ○ | ○ | ○ | ○ |

Evaluation

1. Preparation of a Test Sample

Figure 1:
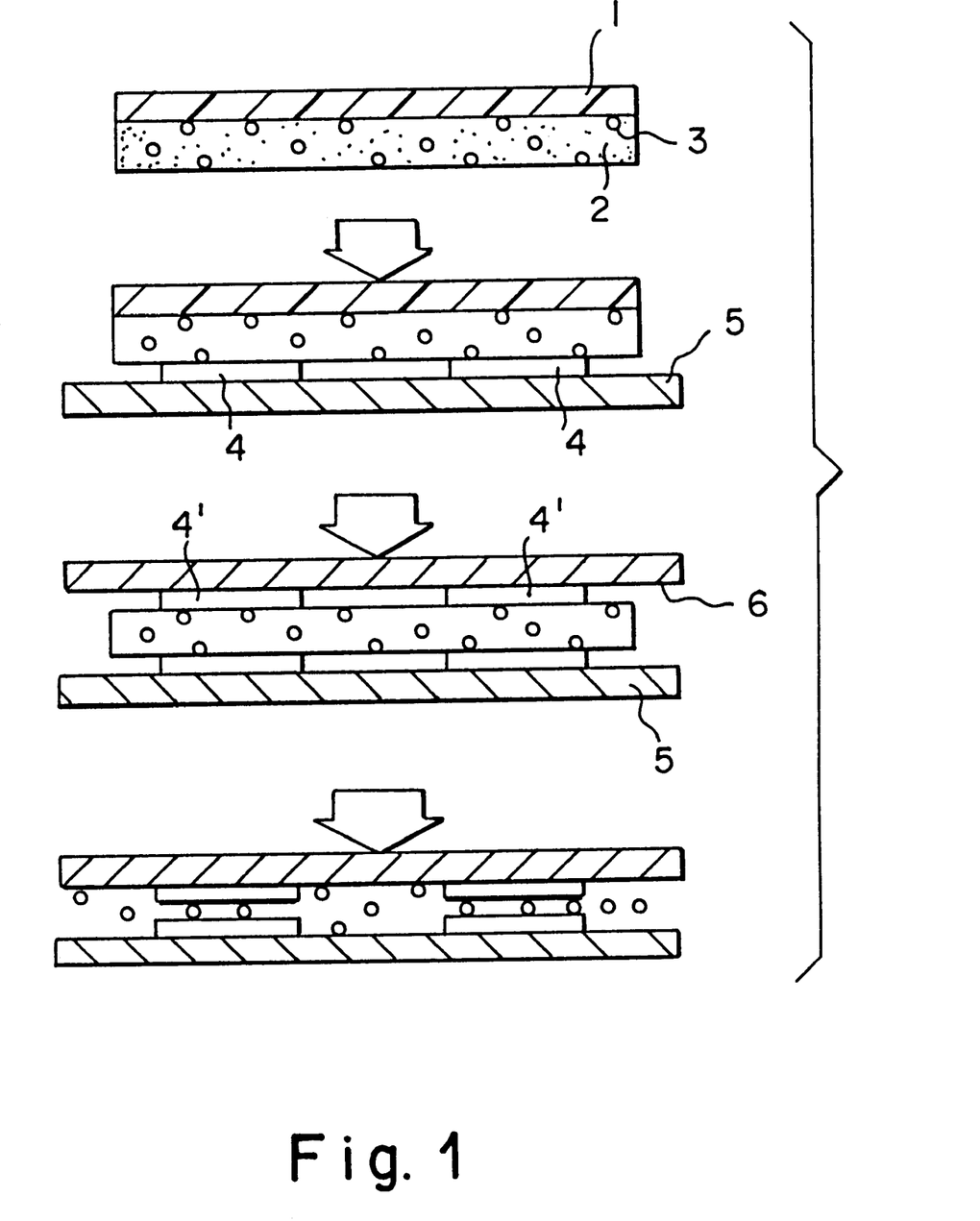
FIG. 1 illustrates steps of bonding PCB and TCP with an anisotropic conductive adhesive of the present invention.

TCP (6) connected with circuit electrodes (4) having pitch of 0.3 mm and number of terminals of 60 which comprises a tin-plated (thickness of tin: 0.5 μm) copper foil (thickness of 25 μm) and polyimide (thickness of 75 μm), and PCB (5) (thickness of 0.8 mm) connected with gold-flashing plated circuit electrodes (4') having pitch of 0.3 mm and number of terminals of 60, the PCB comprsing four layer boards (FR-4) of which outer and inner layers were copper films (thicknesss of 18 μm), were pressed to bond with an anisotropic conductive adhesive (2). In FIG. 11 represents a carrier film for the adhesive (2) and 3 represents conductive particles in the adhesive.

2. Test Method of Bond Strength

The sample was pressed to bond at a temperature of 130° C. and a pressure of 30 kg/cm² for 15 seconds, and was evaluated by 90° peeling test.

3. Test Method of Bonding Reliability

Connection resistance was measured when the sample was prepared and was stored for 100 hours at a temperature of 85° C. and a humidity of 85%. If the connection resistance could not be measured, it was considered "continuity failed (OPEN)".

4. Test Method of Storage Properties

The anisotropic conductive adhesive was stored at a temperature of 25° C. for two weeks. It was applied to the sample and was pressed to bond at a temperature of 130° C. and a pressure of 30 kg/cm² for 15 seconds, and measured for connection resistance. Results are shown in the Tables as ○ for a connection resistance of not greater than 1.5Ω and × for one of more than 1.5Ω.

5. Test Method of Repairing Properties

The anisotropic conductive adhesive was applied to a sample and was pressed to bond at a temperature of 130° C. and a pressure of 30 kg/cm² for 15 seconds, and the TCP was peeled. Remaining resin on PCB was removed with acetone, and fresh anisotropic conductive adhesive was applied on the PCB. It was pressed to bond and a connection resistance and bond strength were measured. Results are shown in the Tables as ○ (good repairing property) for a connection resistance of not greater than 1.5Ω and × (bad repairing property) for one of more than 1.5Ω. If greater than 80% of bond strength was maintained compared to the strength before repair, the result was evaluated as ○ and less than 80% was evaluated as ×.

Example 19

4 Parts by weight of caprolactam modified (meth)acryloyl hydroxyethyl acid phosphate, 1 part by weight of β-(3,4-epoxycyclohexyl)ethyl trimethoxy silane and 100 parts by weight of methyl ethyl ketone were preliminarily reacted at a temperature of 40° C. for one hour. 100 Parts by weight of urethane acrylate resin represented by formula (5), 60 parts by weight of a 50% solution of methacryloyl phenolic novolak resin (n/m+n=0.7/1, m+n=8) represented by formula (4) dissolved in methyl ethyl ketone, 3 parts by weight of 1,1,3,3- tetramethylbutylperoxy hexanoate, 300 parts by weight of a 20% solution of acrylonitrile-butadiene-methacrylic acid copolymer represented by formula (9) dissolved in methyl ethyl ketone and 4 parts by weight of Ni/Au metallized polystyrene particles were added and were dispersed evenly. The mixture was cast on polyethylenterephthalate film treated with a mold parting agent to a thickness of 35 μm after drying. After drying, the product was cut to a width of 2 mm to obtain an anisotropic conductive adhesive.

Example 20

4 Parts by weight of caprolactam modified (meth)acryloyl hydroxyethyl acid phosphate, 1 part by weight of β-(3,4- epoxycyclohexyl)ethyl trimethoxy silane, 100 parts by weight of methyl ethyl ketone, 100 parts by weight of urethane acrylate resin represented by formula (5), 60 parts by weight of a 50% solution of methacryloyl phenolic novolak resin (n/m+n=0.7/1, m+n=8) represented by formula (4) dissolved in methyl ethyl ketone, and 300 parts by weight of a 20% solution of acrylonitrile-butadiene-methacrylic acid copolymer represented by formula (9) dissolved in methyl ethyl ketone were reacted at a temperature of 25° C. for one day. 3 Parts by weight of 1,1,3,3-tetramethylbutylperoxy hexanoate, and 4 parts by weight of Ni/Au metallized polystyrene particles were added and were dispersed evenly. The mixture was cast on polyethylenterephthalate film treated with a mold parting agent to a thickness of 35 μm after drying. After drying, the product was cut to a width of 2 mm to obtain an anisotropic conductive adhesive.

Examples 21, 23, 27 and 28

Anisotropic conductive adhesives were prepared in the same manner as Example 19 except that materials and amounts of materials shown in Table 4 were used.

Examples 22, 24, 25 and 26

Anisotropic conductive adhesives were prepared in the same manner as Example 20 except that materials and amounts of materials shown in Table 4 were used.

TABLE 4

| | | Example | | | | |
|---|---|---|---|---|---|---|
| | | 19 | 20 | 21 | 22 | 23 |
| Radical polymerization resin | G 50% solution of Methyl ethyl ketone | 60 | 60 | | | |
| | H | 100 | 100 | 100 | 100 | 100 |
| | I 50% solution of Methyl ethyl ketone | | | | | |
| | J 20% solution of Tetrahydrofuran | | | | | 150 |
| | K 20% solution of Methyl ethyl ketone | | | | | |
| Organic peroxide | | 3 | 3 | 3 | 3 | 3 |
| Thermoplastic elastomer | L 20% solution of Methyl ethyl ketone | 300 | 300 | | | |
| | M 50% solution of Methyl ethyl ketone | | | | | |
| | N 20% solution of Methyl ethyl ketone | | | | | 300 |
| | O 30% solution of Methyl ethyl ketone | | | 200 | 200 | |
| Phosphoric ester | P | 4.0 | 4.0 | 4.0 | 4.0 | 4.0 |
| | Q | | | | | |
| Epoxy silane coupling agent | R | 1.0 | 1.0 | 1.0 | 1.0 | 1.0 |
| | S | | | | | |
| Conductive particle | | 4.0 | 4.0 | 4.0 | 4.0 | 4.0 |
| Reaction temp. of (A) & (E) (° C.) | | 40 | — | 22 | — | 22 |
| Reaction time of (A) & (E) (hrs) | | 1 | — | 1 | — | 3 |
| Reaction temp. of (A), (B), (C) & (D) (° C.) | | — | 25 | — | 25 | — |
| Reaction time of (A), (B), (C) & (D) (days) | | — | 1 | — | 1 | — |
| (D)/{(A) + (B) + (C)} | | 2.1/100 | 2.1/100 | 2.5/100 | 2.5/100 | 2.1/100 |
| {(D) + (E)}/{(A) + (B) + (C)} | | 2.6/100 | 2.6/100 | 3.1/100 | 3.1/100 | 2.6/100 |
| (D)/(E) | | 80/20 | 80/20 | 80/20 | 80/20 | 80/20 |
| Bond strength (g/cm) | Initial | 1400 | 1500 | 1500 | 1500 | 1500 |
| | After treatment | 1400 | 1400 | 1400 | 1500 | 1400 |
| Bonding reliability (Ω) | Initial | 1.1 | 1.1 | 1.1 | 1.1 | 1.1 |
| | After treatment | 1.2 | 1.2 | 1.2 | 1.2 | 1.2 |
| Repairing properties | | ○ | ○ | ○ | ○ | ○ |
| Storage properties | | ○ | ○ | ○ | ○ | ○ |

| | | Example | | | | |
|---|---|---|---|---|---|---|
| | | 24 | 25 | 26 | 27 | 28 |
| Radical polymerization resin | G 50% solution of Methyl ethyl ketone | | 60 | 60 | | |
| | H | 100 | 100 | 100 | 100 | 100 |
| | I 50% solution of Methyl ethyl ketone | | | | | |
| | J 20% solution of Methyl ethyl ketone | 150 | | | | |
| | K 20% solution of Methyl ethyl ketone | | | | | |

TABLE 4-continued

| | | | | | | |
|---|---|---|---|---|---|---|
| Organic peroxide | | 3 | 3 | 3 | 3 | 3 |
| Thermoplastic elastomer | L 20% solution of Methyl ethyl ketone | | 300 | 300 | | |
| | M 50% solution of Methyl ethyl ketone | | | | | |
| | N 20% solution of Methyl ethyl ketone | 300 | | | | |
| | O 30% solution of Methyl ethyl ketone | | | | 200 | 200 |
| Phosphoric ester | P | 4.0 | 40.0 | 0.08 | 8.0 | 0.05 |
| | Q | | | | | |
| Epoxy silane coupling agent | R | 1.0 | 5.0 | 0.08 | 0.5 | 5.0 |
| | S | | | | | |
| Conductive particle | | 4.0 | 4.0 | 4.0 | 4.0 | 4.0 |
| Reaction temp. of (A) & (E) (° C.) | | — | — | — | 22 | 22 |
| Reaction time of (A) & (E) (hrs) | | — | — | — | 5 | 5 |
| Reaction temp. of (A), (B), (C) & (D) (° C.) | | 25 | 25 | 25 | — | — |
| Reaction time of (A), (B), (C) & (D) (days) | | 2 | 1 | 1 | — | — |
| (D)/{(A) + (B) + (C)} | | 2.1/100 | 21/100 | 0.4/100 | 5.0/100 | 0.3/100 |
| {(D) + (E)}/{(A) + (B) + (C)} | | 2.6/100 | 23.2/100 | 0.8/100 | 5.2/100 | 3.4/100 |
| (D)/(E) | | 80/20 | 89/11 | 50/50 | 94/6 | 9/91 |
| Bond strength (g/cm) | Initial | 1500 | 1800 | 600 | 1700 | 900 |
| | After treatment | 1500 | 1300 | 500 | 1600 | 800 |
| Bonding reliability (Ω) | Initial | 1.1 | 1.2 | 1.1 | 1.1 | 1.1 |
| | After treatment | 1.2 | 1.4 | 1.2 | 1.2 | 1.2 |
| Repairing properties | | ○ | ○ | ○ | | ○ |
| Storage properties | | ○ | ○ | ○ | ○ | ○ |

Example 29

4 Parts by weight of caprolactam modified (meth)acryloyl hydroxyethyl acid phosphate, 1 part by weight of β-(3,4-epoxycyclohexyl)ethyl trimethoxy silane and 100 parts by weight of methyl ethyl ketone were preliminary reacted at a temperature of 22° C. for three hours. 100 parts by weight of urethane acrylate resin represented by formula (5), 60 parts by weight of a 50% solution of methacryloyl phenolic novolak resin (n/m+n=0.7/1, m+n=8) represented by formula (4) dissolved in methyl ethyl ketone and 300 parts by weight of a 20% solution of acrylonitrile-butadiene-methacrylic acid copolymer represented by formula (9) dissolved in methyl ethyl ketone were added and were reacted at a temperature of 25° C. for two days. 3 Parts by weight of 1,1,3,3-tetramethylbutylperoxy hexanoate and 4 parts by weight of Ni/Au metallized polystyrene particles were added and were evenly dispersed. The mixture was cast on polyethylenterephthalate film treated with a mold parting agent to a thickness of 35 μm after drying. After drying, the product was cut to a width of 2 mm to obtain an anisotropic conductive adhesive.

Examples 30~38

Anisotropic conductive adhesives were prepared in the same manner as Example 29 except that materials and conditions shown in Table 5 were used.

TABLE 5

| | | Example | | | | |
|---|---|---|---|---|---|---|
| | | 29 | 30 | 31 | 32 | 33 |
| Radical polymerization resin | G 50% solution of Methyl ethyl ketone | 60 | 60 | 60 | | |
| | H | 100 | 100 | 100 | 100 | 100 |
| | I 50% solution of Methyl ethyl ketone | | | | | |
| | J 20% solution of Tetrahydrofuran | | | | | |
| | K 20% solution of Methyl ethyl ketone | | | | | |
| Organic peroxide | | | | | | |
| Thermoplastic elastomer | L 20% solution of Methyl ethyl ketone | 300 | 300 | 300 | | |
| | M 50% solution of Methyl ethyl ketone | | | | | |
| | N 20% solution of Methyl ethyl ketone | | | | | |
| | O 30% solution of | | | | 200 | 200 |

TABLE 5-continued

|  |  |  |  |  |  |  |
|---|---|---|---|---|---|---|
| Phosphoric ester | Methyl ethyl ketone P |  |  |  | 4.0 | 4.0 |
|  | Q | 4.0 | 4.0 | 4.0 |  |  |
| Epoxy silane coupling agent | R | 1.0 | 1.0 | 1.0 |  |  |
|  | S |  |  |  | 1.0 | 1.0 |
| Conductive particle |  | 4.0 | 4.0 | 4.0 | 4.0 | 4.0 |
| Reaction temp. of (A) & (E) (° C.) |  | 22 | 30 | 40 | 22 | 30 |
| Reaction time of (A) & (E) (hrs) |  | 3 | 1 | 1 | 3 | 1 |
| Reaction temp. of (A), (B), (C) & (D) (° C.) |  | 25 | 25 | 25 | 25 | 25 |
| Reaction time of (A), (B), (C) & (D) (days) |  | 2 | 2 | 2 | 2 | 2 |
| (D)/{(A) + (B) + (C)} |  | 2.1/100 | 2.1/100 | 2.1/100 | 2.5/100 | 2.5/100 |
| {(D) + (E)}/{(A) + (B) + (C)} |  | 2.6/100 | 2.6/100 | 2.6/100 | 3.1/100 | 3.1/100 |
| (D)/(E) |  | 80/20 | 80/20 | 80/20 | 80/20 | 80/20 |
| Bond strength (g/cm) | Initial | 1400 | 1400 | 1400 | 1500 | 1500 |
|  | After treatment | 1300 | 1400 | 1400 | 1500 | 1500 |
| Bonding reliability (Ω) | Initial | 1.1 | 1.1 | 1.1 | 1.1 | 1.1 |
|  | After treatment | 1.2 | 1.2 | 1.2 | 1.2 | 1.2 |
| Repairing properties |  | ◯ | ◯ | ◯ | ◯ | ◯ |
| Storage properties |  | ○ | ○ | ○ | ○ | ○ |

|  |  | Example | | | | |
|---|---|---|---|---|---|---|
|  |  | 34 | 35 | 36 | 37 | 38 |
| Radical polymerization resin | G 50% solution of Methyl ethyl ketone |  | 60 | 60 |  |  |
|  | H | 100 | 100 | 100 | 100 | 100 |
|  | I 50% solution of Methyl ethyl ketone |  |  |  |  |  |
|  | J 20% solution of Tetrahydrofuran |  |  |  |  |  |
|  | K 20% solution of Methyl ethyl ketone |  |  |  |  |  |
| Organic peroxide |  |  |  |  |  |  |
| Thermoplastic elastomer | L 20% solution of Methyl ethyl ketone |  | 300 | 300 |  |  |
|  | M 50% solution of Methyl ethyl ketone |  |  |  |  |  |
|  | N 20% solution of Methyl ethyl ketone |  |  |  |  |  |
|  | O 30% solution of Methyl ethyl ketone | 200 |  |  | 200 | 200 |
| Phosphoric ester | P | 4.0 |  |  | 4.0 | 4.0 |
|  | Q |  | 4.0 | 4.0 |  |  |
| Epoxy silane coupling agent | R |  | 1.0 | 2.0 | 1.0 | 2.0 |
|  | S | 1.0 | 1.0 | 0.5 | 1.0 | 0.5 |
| Conductive particle |  | 4.0 | 4.0 | 4.0 | 4.0 | 4.0 |
| Reaction temp. of (A) & (E) (° C.) |  | 40 | 22 | 30 | 22 | 30 |
| Reaction time of (A) & (E) (hrs) |  | 1 | 3 | 1 | 3 | 1 |
| Reaction temp. of (A), (B), (C) & (D) (° C.) |  | 25 | 25 | 25 | 25 | 25 |
| Reaction time of (A), (B), (C) & (D) (days) |  | 2 | 2 | 2 | 2 | 2 |
| (D)/{(A) + (B) + (C)} |  | 2.5/100 | 2.5/100 | 2.5/100 | 2.5/100 | 2.5/100 |
| {(D) + (E)}/{(A) + (B) + (C)} |  | 3.1/100 | 3.1/100 | 3.4/100 | 3.7/100 | 4.0/100 |
| (D)/(E) |  | 80/20 | 67/33 | 80/20 | 67/33 | 80/20 |
| Bond strength (g/cm) | Initial | 1500 | 1500 | 1500 | 1600 | 1600 |
|  | After treatment | 1400 | 1500 | 1400 | 1500 | 1600 |
| Bonding reliability (Ω) | Initial | 1.1 | 1.1 | 1.1 | 1.1 | 1.1 |
|  | After treatment | 1.2 | 1.2 | 1.2 | 1.2 | 1.2 |
| Repairing properties |  | ◯ | ◯ | ◯ | ◯ | ◯ |
| Storage properties |  | ○ | ○ | ○ | ○ | ○ |

Comparative Examples 1~4

Anisotropic conductive adhesives were prepared in the same manner as Example 1 except that materials and conditions shown in Table 6 were used.

TABLE 6

| | | Comparative Example | | | |
|---|---|---|---|---|---|
| | | 1 | 2 | 3 | 4 |
| Radical polymerization resin | G 50% Solution in methyl ethyl ketone | 200 | 200 | 200 | |
| | J 20% Solution in Tetrahydrofuran | 350 | 350 | 350 | 350 |
| Organic peroxide | | 5 | 5 | 5 | 5 |
| Thermoplastic elastomer | L 20% Solution in methyl ethyl ketone | 500 | 500 | 500 | 500 |
| Phosphoric ester | P | | | | |
| Epoxy silane coupling agent | R | | | 6.5 | |
| Vinyl silane coupling agent | | | | 6.5 | |
| Methacryl silane coupling agent | | | | | 6.5 |
| Conductive particles | | 7.0 | 7.0 | 7.0 | 7.0 |
| Reaction temp. of (A) & (E) (° C.) | | | | | |
| Reaction time of (A) & (E) (hrs) | | | | | |
| Reaction temp. of (A), (B), (C) & (D) (° C.) | | | | | |
| Reaction time of (A), (B), (C) & (D) (days) | | | | | |
| (D)/{(A) + (B) + (C)} | | 0/100 | 0/100 | 0/100 | 0/100 |
| {(D) + (E)}/{(A) + (B) + (C)} | | 0/100 | 2.4/100 | 2.4/100 | 2.4/100 |
| (D)/(E) | | — | 0/100 | 0/100 | 0/100 |
| Bond strength (g/cm) | Initial | 300 | 400 | 300 | 400 |
| | After treatment | 200 | 200 | 200 | 200 |
| Bonding reliability (Ω) | Initial | 1.1 | 1.1 | 1.1 | 1.2 |
| | After treatment | 1.2 | 2.3 | 1.3 | 1.3 |
| Repairing properties | | ○ | ○ | ○ | ○ |
| Storage properties | | ○ | X | X | X |

ADVANTAGES OF THE INVENTION AND INDUSTRIAL APPLICABILITY

The present invention provides a thermosetting resin type anisotropic conductive adhesive having excellent processsability and long term reliability and a method for preparing the same. The anisotropic conductive adhesive of the present invention makes it possible to bond fine circuit electrodes at a low temperature around 130° C. An electronic apparatus in which the anisotropic conductive adhesive of the present invention is used to bond electronic or electric parts is easy to repair. The adhesive is valuable to improve productivity of expensive electronic apparatus.

What is claims is:

1. An anisotropic conductive adhesive comprising conductive particles dispersed in a resin composition, wherein said resin composition comprises a radical polymerization resin (A), an organic peroxide (B), a thermoplastic elastomer (C) and a phosphoric ester (D) represented by formula (1)

(1)

wherein $R^1$ is $CH_2=CR_1CO(OR_2)_n$ where $R_1$ is —H or —$CH_3$, $R_2$ is —$C_2H_4$—, —$C_3H_6$—, —$CH_2CH(CH_3)$—, —$C_4H_8$—, —$C_5H_{10}$—, —$C_6H_{12}$— or —$C_2H_4$—O—CO—$C_5H_{10}$— and n is an integer of 1–10; l is 1 or 2 and m is 1 or 2.

2. An anisotropic conductive adhesive according to claim 1, wherein a blending ratio of (A), (B), (C) and (D) in parts by weight is within a range of $(D)/\{(A)+(B)+(C)\} \times 100 = (0.1 \sim 50)$.

3. An anisotropic conductive adhesive according to claim 1, wherein said resin composition further comprises an epoxy silane coupling agent (E) represented by formula (2) or (3)

(2)

(3)

wherein $R^2$ is —$CH_3$ or —$C_2H_5$.

4. An anisotropic conductive adhesive according to claim 3, which is formed by reacting said radical polymerization resin (A), said thermoplastic elastomer (C), said phosphoric ester (D) and said epoxy silane coupling agent (E) to form a preliminary reaction product and thereafter combining said reaction product with other components of the adhesive.

5. An anisotropic conductive adhesive according to claim 4, wherein said radical polymerization resin (A), said thermoplastic elastomer (C), said phosphoric ester (D) and said epoxy silane coupling agent (E) are reacted at a temperature of 0~50° C.

6. An anisotropic conductive adhesive according to claim 3, wherein said resin component is prepared by reacting said phosphoric ester (D) and said epoxy silane coupling agent (E) at a temperature of 0~50° C. to form a first reaction product, reacting said first reaction product with said radical polymerization resin (A) and said thermoplastic elastomer (C) to form a second reaction product, and then mixing said second reaction product with other components.

7. An anisotropic conductive adhesive according to claim 3, wherein a blending ratio of (A), (B), (C), (D) and (E) in parts by weight is within a range of $\{(D)+(E)\}/\{(A)+(B)+(C)\} \times 100 = (0.1 \sim 20)$.

8. An anisotropic conductive adhesive according to claim 3, wherein a blending ratio of said phosphoric ester (D) and said epoxy silane coupling agent (E) in parts by weight is $(D)/(E) = 90/10 \sim 10/90$.

9. An electronic apparatus characterized in that an electrical connection of an electronic or electric part is formed by an anisotropic conductive adhesive according to claim 1.

10. An electronic apparatus according to claim 9, wherein said electronic or electric part is a semiconductor device, a printed circuit board, a liquid crystal display or a tape carrier package.

11. An electronic apparatus according to claim 9, wherein said electronic apparatus is a liquid crystal module, a computer or television.

12. An electronic apparatus characterized in that an electrical connection of an electronic or electric part is formed by an anisotropic conductive adhesive according to claim 3.

13. An electronic apparatus according to claim 12, wherein said electronic or electric part is a semiconductor device, a printed circuit board, a liquid crystal display or a tape carrier package.

14. An electronic apparatus according to claim 12, wherein said electronic apparatus is a liquid crystal module, a computer or television.

* * * * *